United States Patent [19]
McClure

[11] Patent Number: 5,594,373
[45] Date of Patent: Jan. 14, 1997

[54] OUTPUT DRIVER CIRCUITRY WITH SELECTIVE LIMITED OUTPUT HIGH VOLTAGE

[75] Inventor: David C. McClure, Denton, Tex.

[73] Assignee: SGS-Thomson Microelectronics, Inc., Carrollton, Tex.

[21] Appl. No.: 359,397

[22] Filed: Dec. 20, 1994

[51] Int. Cl.⁶ ................................................ H03B 21/00
[52] U.S. Cl. ..................... 327/108; 327/538; 327/543
[58] Field of Search .................................... 323/313, 315, 323/316; 326/80, 81; 327/108–112, 319, 333, 412, 530, 534, 535, 537, 538, 540, 541, 543

*Primary Examiner*—Timothy P. Callahan
*Assistant Examiner*—Jeffrey Zweizig
*Attorney, Agent, or Firm*—Rodney M. Anderson; Theodore E. Galanthay; Robert Groover

[57] ABSTRACT

An output driver circuit for an integrated circuit is disclosed, where the output driver drives an output terminal with a high logic level having a voltage limited from the power supply voltage of the integrated circuit. The limited voltage is provided by applying a limited output high voltage to an output buffer, such that the drive signal applied to the gate of the pull-up transistor in the output driver is limited by the limited output high voltage applied to the output buffer. A voltage reference and regulator circuit for generating the limited output high voltage is also disclosed, and is based on a current mirror. The sum of the current in the current mirror is controlled by a bias current source, which may be dynamically controlled within the operating cycle or programmed by way of fuses. An offset compensating current source adds current into the reference leg of the current mirror to eliminate the development of an offset voltage in the current mirror, and the limited output high voltage is shifted by the threshold voltage of the pull-up drive transistor by way of a threshold shift circuit.

21 Claims, 6 Drawing Sheets

1

OUTPUT DRIVER CIRCUITRY WITH SELECTIVE LIMITED OUTPUT HIGH VOLTAGE

This invention is in the field of integrated circuits, and is more particularly directed to output drive circuitry thereof.

This application is related to applications Ser. No. 08/360,228 (Attorney's Docket No. 94-C-116), Ser. No. 08/360,229 (Attorney's Docket No. 94-C-121), Ser. No. 08/359,925 (Attorney's Docket No. 94-C-124), Ser. No. 359,926 (Attorney's Docket No. 94-C-125), and Ser. No. 359,927 (Attorney's Docket No. 94-C-126), all filed contemporaneously with this application. All of these applications are assigned to SGS-Thomson Microelectronics, Inc.

The innovative embodiments of the present application are particularly described on pages 12–16 and 34–39, and shown in FIGS. 2 and 10. The remaining text and figures provide background in the art and the context of other innovative embodiments further described in the above related applications.

BACKGROUND OF THE INVENTION

In modern digital integrated circuits, particularly those fabricated according to the well-known complementary metal-oxide-semiconductor (CMOS) technology, data output circuitry is generally implemented in the form of push-pull drive circuits. As is well known in the art, push-pull output drive circuits include two drive transistors; one drive transistor (the pull-up device) drives the output terminal toward the positive power supply voltage to effect a logic high level, while the second drive transistor (the pull-down device) drives the output terminal toward ground to effect a logic low level. In CMOS circuits, the pull-up device is generally implemented as a p-channel MOS transistor while the pull-down device is implemented as an n-channel MOS transistor. This configuration ensures that no DC current is drawn by the output driver. In addition, use of a p-channel pull-up device allows the output terminal to be driven fully to the power supply voltage, i.e., from "rail-to-rail", as there is no threshold voltage drop across the p-channel pull-up device (as there would be if the pull-up device were an n-channel transistor).

Most MOS integrated circuits fabricated over the last fifteen years have been powered from a nominal 5 volt power supply. However, with the advent of ultra thin gate dielectric layers used in the fabrication of modern MOS transistors, however, many recent integrated circuits are powered from a nominal 3.3 volt power supply. Since both types of circuits remain available and useful in modern digital systems, data must often be communicated from a 5 volt circuit to a 3.3 volt circuit over communication lines or buses. If all integrated circuits in the system were to utilize the same power supply bias, rail-to-rail output levels would be not only acceptable, but preferred. However, if mixed power supply devices are incorporated into the same system, care must be taken that a logic high level signal driven by a 5 volt device does not exceed 3.3 volts, to prevent damage to 3.3 volt devices receiving such a signal.

In such situations, it is desirable for the 5 volt device to provide an output high voltage level that meets an extremely stringent set of specification requirements. These requirements include a minimum logic high voltage level ($V_{OH}$) of 2.4 volts and a maximum $V_{OH}$ of 3.3 volts, while providing 4 mA of source current in each condition, considering the specification variations of the 5 volt power supply the necessity to meet the specification for maximum and minimum output load conditions, all over an expected variation in manufacturing process parameters. In addition, particularly for integrated circuits in high performance systems, it is especially desirable to provide fast switching performance with minimum overshoot and undershoot (e.g., with settling times of less than 10 nsec), and with minimum circuit output impedance.

According to conventional design methodologies, these specification constraints may not be achievable, for circuits with typical process and voltage variations. For a $V_{OH}$ maximum voltage of 3.3 volts and a $V_{OH}$ minimum voltage of 2.4 volts, the total operating window (i.e., the difference therebetween) is 0.9 volts. According to typical modern design parameters, mere consideration of the maximum and minimum output load conditions (4 mA to 0 mA) translates to a reduction in the operating window of 0.75 volts. Variations in the power supply voltage will cause variations in the output driver reference voltage, typically generated by a resistor divider, reduces the operating window by another 0.30 volts. Minimum guardbanding on the minimum level of 2.4 volts is typically 200 mV. Accordingly, even if one were to ignore the effect of process variations, the sum of the operating window reductions due to these factors is 1.25 volts, indicating that a $V_{OH}$ maximum of 3.3 volts is not achievable with conventional CMOS technology, even in the best case (i.e., no process variations).

For the output driver that drives a high output voltage to less than the power supply level, as would be the case for a 5 volt output driver driving a $V_{OH}$ maximum of 3.3 volts, an n-channel pull-up device may be used, and would be preferable due to the greater mobility of n-channel MOS transistors relative to p-channel MOS transistors. In this case, the gate voltage applied to the n-channel pull-up device (to turn it on) must be above the $V_{OH}$ minimum level by at least the threshold voltage of the device. It will be appreciated that an excessively high gate bias voltage on the pull-up device will limit the circuit options available for implementing the reduced $V_{OH}$ maximum output driver. While the required gate voltage could be reduced by either biasing the body node of the n-channel pull-up device to its source (i.e., to the output pad) or by using an n-channel pull-up device with a natural (non-implanted) threshold voltage, these options are undesirable, considering vulnerability of the circuit to latchup (in the case where $V_{BS}=0$), and the instability and reduced reliability of natural $V_t$ transistors.

The combination of these factors has made difficult the design and implementation of output driver circuitry in which the operating window between $V_{OH}$ minimum and $V_{OH}$ maximum is limited. This difficulty is exacerbated by performance requirements of high switching speeds, and also by noise consideration in integrated circuits having as many as eighteen output switching simultaneously.

As will be described hereinbelow, circuitry for providing the proper drive to the output terminal to meet the $V_{OH}$ maximum of a lower voltage has been developed. It has been discovered, however, that it is desirable in certain situations to disable the limiting of the $V_{OH}$ maximum, such that a full $V_{cc}$ power supply level may be driven at the output terminal.

It is therefore an object of the present invention to provide output driver circuitry that can rapidly switch an output terminal while maintaining a relatively small operating window for the high logic level output voltage, in a selectable manner.

It is another object of the present invention to provide such circuitry that may be selectably disabled in a special test mode.

It is another object of the present invention to provide such circuitry that may be selectably disabled during operation.

It is another object of the present invention to provide such circuitry that may be programmably disabled or enabled.

It is another object of the present invention to provide a selectable output high level maximum voltage.

Other objects and advantages of the present invention will be apparent to those of ordinary skill in the art having reference to the following specification together with its drawings.

SUMMARY OF THE INVENTION

The invention may be implemented into an integrated circuit as an output driver system in which the voltage applied to the gate of the pull-up device is set at a voltage above the $V_{OH}$ operating window but below the circuit power supply. The system includes circuitry for generating the proper gate voltage to the pull-up device based upon a regulated voltage. The regulated voltage is produced by a combination voltage reference and voltage regulator circuit, where the regulated voltage is shifted by a threshold voltage to allow the output driver to be an n-channel device with its body node back-biased. The regulated voltage serves as the bias voltage in the output buffer, so that the output voltage of the output buffer as applied to the gate of the n-channel pull-up device is limited. Circuitry is provided for selectably disabling the function, such as in a special test mode, responsive to a logic signal, or by way of fuse programming, to allow multiple high level maximum voltage drive capability. Fuse adjustment of the reference voltae may also be utilized.

DETAILED DESCRIPTION OF THE PREFERRED EMBODIMENTS

As will become apparent from the following description, it is contemplated that the present invention may be implemented into many types of integrated circuits that generate digital output signals. Examples of such integrated circuits include memory circuits of the read-only, programmable read-only, random access (either static or dynamic), and FIFO types, timer circuits, microprocessors, microcomputers, microcontrollers, and other logic circuits of the general or programmable type. For purposes of description, the preferred embodiment of the invention will be described for the example of a memory integrated circuit, as memory circuits are contemplated to be often used to provide output data to an integrated circuit (such as a microprocessor) having a lower power supply voltage.

Figure 1:
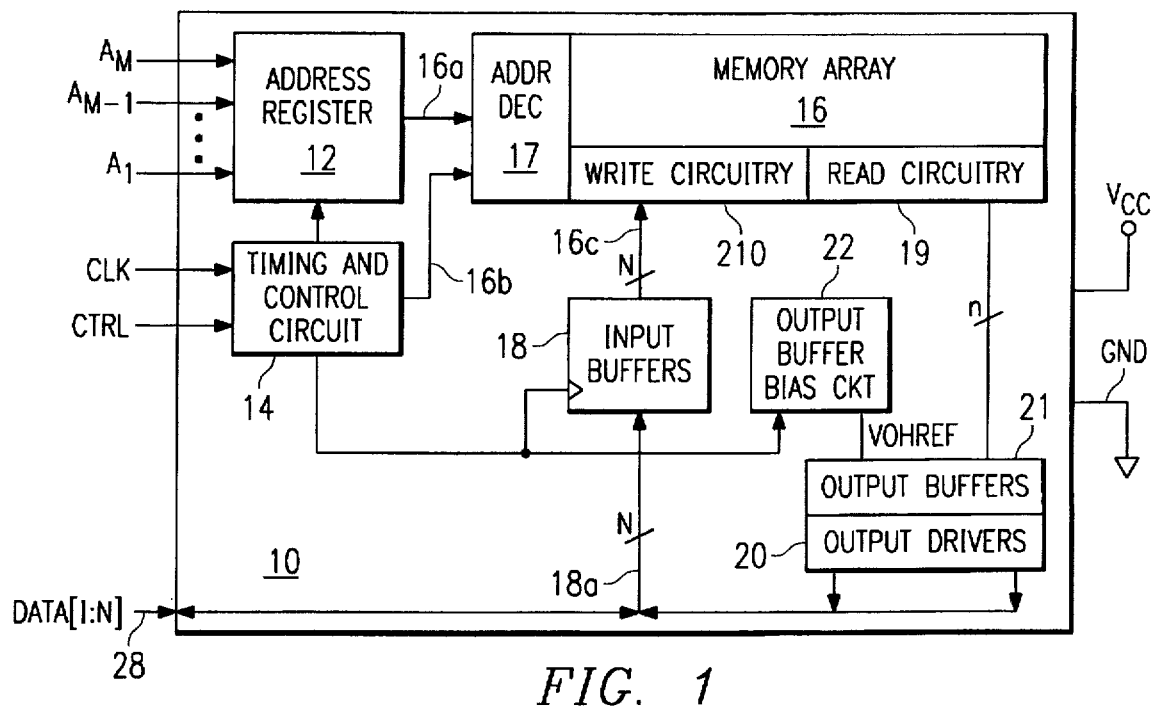
FIG. 1 is an electrical diagram, in block form, of an integrated memory circuit incorporating output drive circuitry according to the preferred embodiment of the invention.

FIG. 1 illustrates a block diagram of read/write memory 10 in which the preferred embodiment of the present invention is implemented. Memory 10 includes a plurality of memory cells arranged in memory array 16. In general, memory 10 operates to receive an M bit address and, synchronous to a system clock (denoted "CLK"), to output an N bit data quantity. Integers M and N are selected by the designer according to the desired memory density and data path size. Selected memory cells in memory array 16 are accessed by operation of address register 12, timing and control circuit 14, and address decoder 17, in the conventional manner and as will be described hereinbelow. Data terminals 28 allow for communication of data to and from read/write memory 10; while data terminals 28 in this example are common input/output terminals, it will of course be understood that separate dedicated input terminals and output terminals may alternatively be implemented in memory 10. Data is read from the selected memory cells in memory array 16 via read circuitry 19 (which may include sense amplifiers, buffer circuitry, and the like, as conventional in the art), output buffers 21, and output drivers 20; conversely, data is written to the selected memory cells in memory array 16 via input drivers 18 and write circuitry 210.

Address register 12 includes an integer M number of address inputs labeled $A_1$ through $A_M$. As known in the memory art, the address inputs allow an M bit address to be applied to memory 10 and stored in address register 12. In this example, memory 10 is of the synchronous type, and as such the address value at address inputs A is clocked into address register 12 via CLK, where CLK is passed to address register 12 from timing and control circuit 14. Once the address is stored, address register 12 applies the address to memory array 16 via address decoder 17, in the usual manner. Timing and control circuit 14 is also illustrated as having a generalized set of control inputs (denoted "CTRL") which is intended to represent various control and/or timing signals known in the art, such as read/write enable, output enable, burst mode enable, chip enable, and the like.

In this example, memory 10 receives electrical power from power supply terminal $V_{cc}$, and also has a reference voltage terminal GND. According to the preferred embodiment of the invention, memory 10 will be presenting output data at data terminals 28 for receipt by another integrated circuit that is powered by a power supply voltage lower than that applied to terminal $V_{cc}$ of memory 10. For example, the power supply voltage applied to terminal $V_{cc}$ of memory 10 may nominally be 5 volts (relative to the voltage at terminal GND) while an integrated circuit receiving data presented by memory 10 at terminals 28 may have a power supply voltage of nominally 3.3 volts. In order to allow this condition, the maximum voltage driven by output drivers 20 of memory 10 at data terminals 28 must be at or near this lower power supply voltage (i.e., at or near 3.3 volts), to avoid damage to the downstream integrated circuit. As will be described in detail hereinbelow, the preferred embodiment of the present invention is intended to provide such limitation on the maximum output high level voltage driven by output drivers 20 of memory 10.

Memory array 16 is a standard memory storage array sized and constructed according to the desired density and architecture. In general, array 16 receives decoded address signals from address decoder 17, responsive to which the desired one or more memory cells are accessed. One of the control signals, as noted above, selects whether a read or write operation is to be performed. In a write operation, input data presented to data terminals 28, and communicated via input buffers 18, are presented to the selected memory cells by write circuitry 210. Conversely, in a read operation, data stored in the selected memory cells are presented by read circuitry 19 to output buffers 21. Output buffers 21 then produce control signals to output drivers 20, to present digital output data signals at data terminals 28. In either case, internal operation of memory 10 is controlled by timing and control circuitry 14, in the conventional manner.

According to the preferred embodiment of the invention, memory 10 further includes output buffer bias circuit 22. Output buffer bias circuit 22 generates a bias voltage on line VOHREF that is presented to output buffers 21 so that the control signals presented by output buffers 21 in turn limit the maximum output voltage driven by output drivers 20 on data terminals 28. As indicated in FIG. 1, and as will be described in further detail hereinbelow, output buffer bias circuit 22 according to the preferred embodiment of the invention is controlled by timing and control circuitry 14 according to the timing of the memory access cycle.

Figure 2:
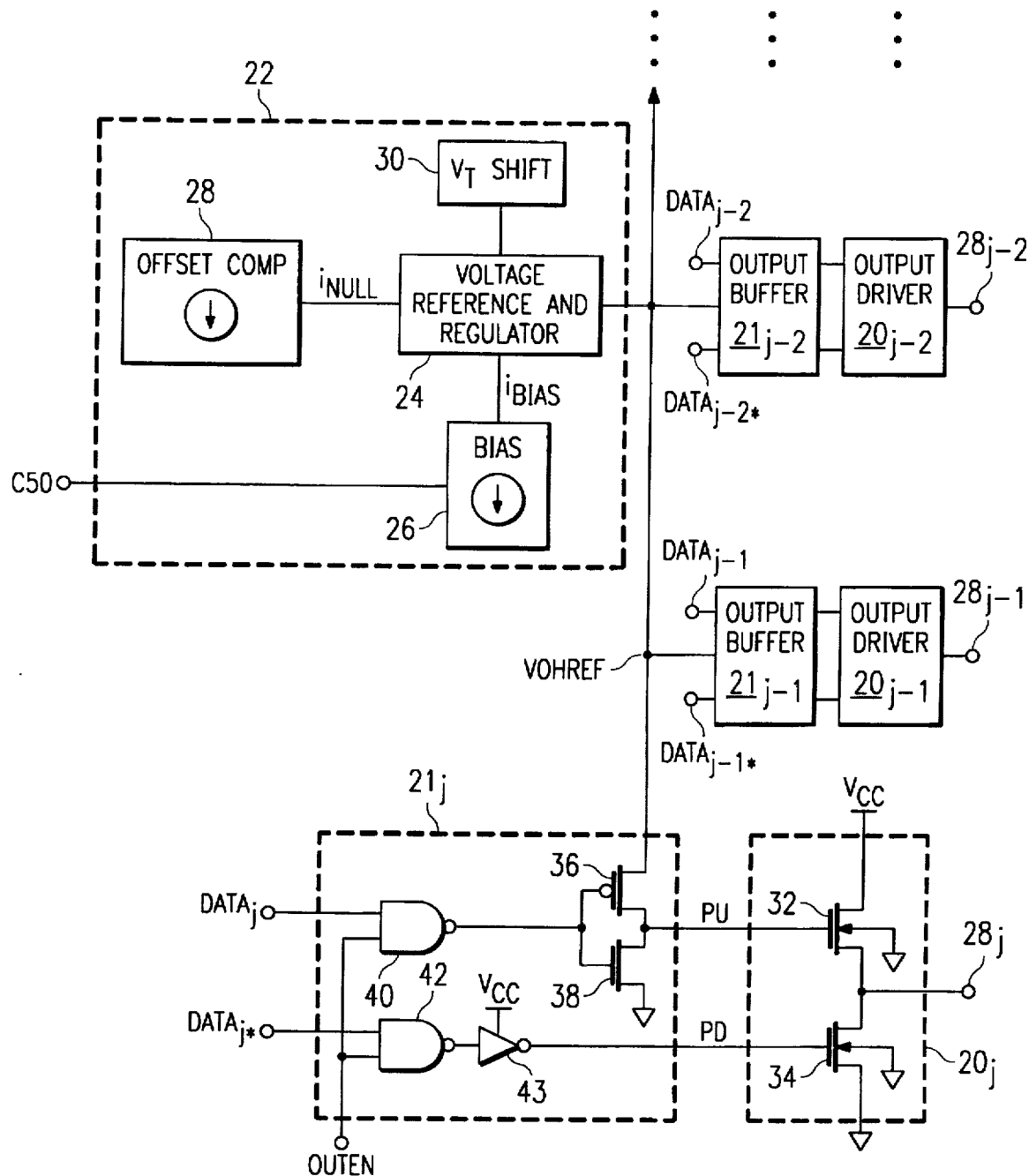
FIG. 2 is an electrical diagram, in block form, of the output drive circuitry according to the preferred embodiment of the invention.

Referring now to FIG. 2, the construction of output buffer bias circuit 22 and its cooperation with output buffers 21 and output drivers 20 according to the preferred embodiment of the present invention will be described in further detail. As shown in FIG. 2, output buffer bias circuit 22 includes voltage reference and regulator 24, which produces a regulated voltage VOHREF at its output. Output buffer bias circuit 22 further includes bias current source 26 which, as will be described in further detail hereinbelow, is controlled by a clock signal generated on line C50 by timing and control circuitry 14; bias current source 26 produces a bias current $i_{BIAS}$ used by voltage reference and regulator 24 in generating the voltage on line VOHREF. Also according to this embodiment of the invention, voltage reference and regulator 24 receives an offset compensating current $i_{NULL}$ from offset compensating current source 28. Output buffer bias circuit 22 further includes $V_t$shift circuit 30, which serves to set the voltage VOHREF. The detailed construction and operation of output buffer bias circuit 22 and its respective constituent blocks will be described in further detail hereinbelow.

Voltage VOHREF is presented to each of the output buffers 21. As such, output buffer bias circuit 22 serves multiple ones of output buffers 21; in many cases, depending upon the number of output buffers 21, a single output buffer bias circuit 22 may suffice to control all of the output buffers 21. Each output buffer 21 receives complementary data inputs DATA, DATA*, which are generated by read circuitry 19 (see FIG. 1). For example, output buffer $21_j$ receives complementary data inputs $DATA_j$, $DATA_j$* (the * indicating logical complement). Each output buffer 21 presents control signals (shown as PU and PD for output buffer $21_j$) to a corresponding output driver 20. Each output driver 20 drives a corresponding data terminal 28. While, as shown in FIG. 1, data terminals are common input/output terminals, the input side (i.e., data input buffers, etc.) are not shown in FIG. 2 for the sake of clarity.

Each output buffer 21 in this embodiment of the invention is implemented as an n-channel push-pull driver. Referring specifically to output driver $20_j$, which is shown in detail in FIG. 2 (it being understood that the other output drivers 20 are similarly constructed), n-channel pull-up transistor 32 has its drain biased to $V_{cc}$ and its source connected to data terminal $28_j$, and n-channel pull-down transistor 34 has its drain connected to data terminal $28_j$ and its source biased to ground. Output drivers 20 also preferably include electrostatic discharge protection devices (not shown), as is conventional in the art. The gates of transistors 32, 34 receive control signals PU, PD, respectively, from output buffer 21. As will be appreciated by those of ordinary skill in the art, since $V_{cc}$ (nominally 5 volts, for example) biases the drain of pull-up transistor 32, the voltage of line PU applied to the gate of transistor 32 must be properly controlled to ensure that the maximum voltage to which transistor 32 drives data terminal $28_j$ in presenting a logical one (referred to as $V_{OH}$ maximum) does not exceed the limit (e.g., 3.3 volts). The way in which this limitation is accomplished according to the preferred embodiment of the invention will be described hereinbelow.

As is shown in FIG. 2, the body node of n-channel pull-up transistor 32 is preferably biased to ground, rather than to its source at data terminal $28_j$. It will be appreciated by those of ordinary skill in the art that this body node bias for n-channel pull-up transistor 32 is preferred to avoid vulnerability to latchup. However, as will also be appreciated, this bias condition for transistor 32 will effectively increase its threshold voltage, making it more difficult to limit $V_{OH}$ maximum driven by output driver 20. This difficulty is due to the higher voltage to which line PU must be driven in order to turn on transistor 32. The preferred embodiment of the present invention, as will be described hereinbelow, addresses this difficulty in such a way as to allow the body node of transistor 32 to be back biased (i.e., to a voltage other than that of its source).

Output Buffer

The construction of output buffer $21_j$ as shown in FIG. 2 will now be described in detail, it being understood that the other output buffers 21 are similarly constructed. Output buffer $21_j$ receives the data input lines $DATA_j$, $DATA_j$* at an input of respective NAND functions 40, 42. Output enable line OUTEN is also received at an input of each of NAND functions 40, 42 to perform an output enable function as will be described hereinbelow.

The output of NAND function is applied to the gates of p-channel transistor 36 and n-channel transistor 38. P-channel transistor 36 has its source biased to the voltage VOHREF generated by output buffer bias circuit 22, and has its drain connected to line PU. N-channel transistor 38 has its drain connected to line PU and its source biased to ground. As such, transistors 36, 38 form a conventional CMOS inverter for driving line PU with the logical complement of the logic signal presented by NAND function 40. However, the high voltage to which line PU is driven by transistor 36 is limited to the voltage VOHREF generated by output buffer bias circuit 22. Since line PU is presented to the gate of n-channel pull-up transistor 32 in output driver 20$_j$, the voltage VOHREF thus will control the maximum drive of pull-up transistor 32, and thus the voltage to which data terminal 28$_j$ is driven.

On the low side, the output of NAND function 42 is applied to the input of inverter 43 (which, in this case, is biased by $V_{cc}$). The output of inverter 43 drives line PD, which is applied to the gate of n-channel pull-down transistor 34.

In operation, with output enable line OUTEN at a high logic level, the state of NAND functions 40, 42 are controlled by the state of data input lines DATA$_j$, DATA$_j$, and will be the logical complement of one another (since data input lines DATA$_j$, DATA$_j$* are the logical complement of one another). A high logic level on line DATA$_j$ will thus result in a low logic level at the output of NAND function 40, turning on transistor 36 so that the voltage VOHREF is applied to the gate of transistor 32 via line PU, driving data terminal 28$_j$ to a high logic level (limited by the voltage of VOHREF as noted above); the output of NAND function 42 in this condition is high (data line DATA$_j$, being low) which, after inversion by inverter 43, turns off transistor 34 in output driver 20$_j$. In the other data state, the output of NAND function 40 will be high (data line DATA$_j$ being low), turning on transistor 38 to pull line PU low to turn off transistor 32; the output of NAND function 42 will be low, causing inverter 43 to drive line PD high and turn on transistor 34, pulling data terminal 28$_j$ low. With output enable line OUTEN at a low logic level, the outputs of NAND functions 40, 42 are forced high regardless of the data state applied by data input lines DATA$_j$, DATA$_j$; as a result, transistors 32, 34 are both turned off, maintaining data terminal 28$_j$ in a high impedance state.

As noted above, the voltage on line VOHREF in this embodiment of the invention determines the drive applied to n-channel pull-up transistors 32 in output drivers 20. According to this embodiment of the invention, therefore, the construction of output buffer 21 in providing the voltage VOHREF to the gate of pull-up transistor 32 is particularly beneficial, as it is implemented with a minimum of transistors, and can rapidly switch to effect fast transitions at data terminals 28. In addition, no series devices are required in output drivers 20 to limit $V_{OH}$ maximum according to this embodiment of the invention, such series devices necessarily reducing the switching speed of output drivers 20 and also introducing vulnerability to electrostatic discharge and latchup. Furthermore, no bootstrapping of the gate drive to n-channel transistor 32 is required according to this embodiment of the invention, thus avoiding voltage slew and bump sensitivity.

The construction of output buffer bias circuit 22 in presenting the proper voltage VOHREF, so that memory 10 in this embodiment of the invention may drive a logic high level to a safe maximum level for receipt by integrated circuits having lower power supply voltages will now be described in detail, with respect to each of the circuit functions of output buffer bias circuit 22 shown in FIG. 2.

Voltage Reference and Regulator with $V_t$ Shift

Figure 3:
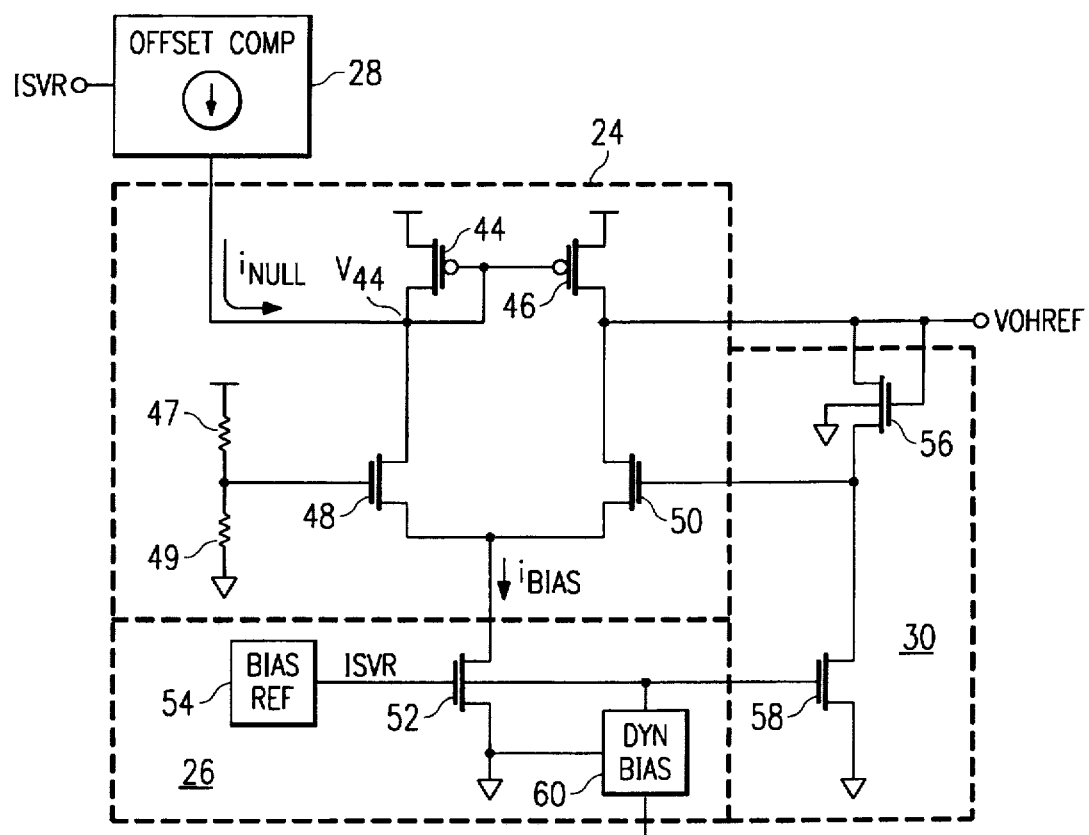
FIG. 3 is an electrical diagram, in schematic form, of a voltage reference and regulator circuit according to the preferred embodiment of the invention.

Referring now to FIG. 3, the construction and operation of voltage reference and regulator 24 will now be described in detail, in cooperation with the other elements of output buffer bias circuit 22.

As shown in FIG. 3, voltage reference and regulator 24 is constructed in current mirror fashion. P-channel transistors 44 and 46 each have their sources biased to Vcc, and have their gates connected together. In the reference leg of this current mirror, the drain of transistor 44 is connected to its gate, and to the drain of n-channel transistor 48. The gate of n-channel transistor 48 is connected to a voltage divider constructed of resistors 47, 49 connected in series between $V_{cc}$ and ground, where the gate of transistor 48 is connected at the point between resistors 47 and 49 to receive the desired fraction (e.g., 60%) of the $V_{cc}$ power supply voltage. Alternatively, each leg of the resistor divider may be constructed of a series of resistors that are initially shorted out by fuses; opening of selected fuses can thus allow programmability of the voltage applied to the gate of transistor 48.

The source of transistor 48 is connected to bias current source 26. In the mirror leg of this current mirror, the drain of transistor 46 is connected, at output node VOHREF, to the drain of n-channel transistor 50. The gate of transistor 50 is coupled to node VOHREF via $V_t$ shift circuit 30, in a manner that will be described in further detail hereinbelow. The source of n-channel transistor 50 is connected to the source of transistor 48 in the reference leg and thus to bias current source 26. As noted above, bias current source 26 conducts a current $i_{BIAS}$, which will be the sum of the currents in the reference and mirror legs in the current mirror of voltage reference and regulator 24 (i.e., the sum of the currents through transistors 48 and 50). The current $i_{BIAS}$ is primarily produced by n-channel transistor 52 which has its drain connected to the sources of transistors 48 and 50, its source biased to ground, and its gate controlled by bias reference circuit 54. As will be further described in detail below, according to the preferred embodiment of the invention, dynamic bias circuit 60 is also provided for controlling the current $i_{BIAS}$ may be decreased at certain times in the memory access cycle (under the control of clock signal C50), to optimize the output impedance of voltage reference and regulator 24 for different portions of the memory access cycle.

$V_t$ shift circuit 30 provides the bias of the gate of n-channel transistor 50 in the mirror leg of voltage reference and regulator 24 in this preferred embodiment of the invention, to ensure that voltage VOHREF is shifted upward by an n-channel threshold voltage, considering that voltage VOHREF will be applied (via output buffers 21) to the gate of n-channel pull-up transistors 32 in output drivers 21. The way in which this shift is effected will be described hereinbelow with the operation of voltage reference and regulator 24.

The operation of voltage reference and regulator 24 will now be described in detail, at a point in the memory cycle during which output data is to be presented at data terminals 28. Bias reference circuit 54 presents a bias voltage to the gate of n-channel transistor 52 to set the value of $i_{BIAS}$ conducted through the current mirror; dynamic bias circuit 60 is effectively off at this time. The divided voltage generated by resistors 47, 49, which is presented as a reference voltage to the gate of n-channel transistor 48, determines the extent to which transistor 48 is conductive, and thus determines the bias condition at the drain of p-channel transistor 44. The current conducted by transistor 44 is mirrored by transistor 46 in the mirror leg, and will thus be a multiple of the current conducted by transistor 44 (as will be discussed hereinbelow).

The voltage VOHREF at the drains of transistors 46, 50 will be determined by the voltage at the drains of transistors 44, 48, by the relative sizes of the transistors in the circuit, and by the effect of $V_t$ shift circuit 30. As is well known in the art of current mirror circuits, the gate voltage of transistor 50 will tend to match that at the gate of transistor 48, due to the feedback of the voltage at line VOHREF to the gate of transistor 50, considering the differential amplifier effect of voltage reference and regulator 24. $V_t$ shift circuit 30, however, includes transistor 56, connected in diode fashion with its gate connected to its drain at VOHREF, and with its source connected to the gate of transistor 50, so that a threshold voltage drop is present between line VOHREF and the gate of transistor 50. Transistor 56 is constructed similarly as one of n-channel pull-up transistors 32 in output drivers 20, particularly in having the same or similar gate length and in having the same body node bias (e.g., to ground). N-channel transistor 58 has its drain connected to the source of transistor 56, and has its gate controlled by bias reference circuit 54, to ensure proper current conduction through transistor 56 so that an accurate threshold voltage drop is present across transistor 56.

As a result of $V_t$ shift circuit 30, the voltage at line VOHREF will be boosted from the reference voltage at the gate of transistor 48 by a threshold voltage value that closely matches the threshold voltage of the n-channel pull-up transistor 32 of output drivers 20. This additional threshold voltage shift is necessary considering that the voltage VOHREF will be applied to the gate of an n-channel pull-up transistor 32 in output drivers 20, thus ensuring adequate high level drive. The $V_t$ shift is effected by circuit 30 in a way that does not increase the output impedance of voltage reference and regulator 24, particularly in the impedance to sink current through transistor 50 in the event of fluctuations of voltage VOHREF caused by switching output buffers 21. The implementation of circuit 30 also introduces minimum offset voltage into voltage reference and voltage regulator 24, and requires only two additional transistors 56, 58 without adding an entire stage.

It is of course contemplated that the voltage generated on line VOHREF by voltage reference and regulator 24 may be applied to control the logic level high drive of output driver 20 in alternative ways to that described hereinabove relative to the preferred approach of controlling the source voltage of pull-up transistors 36 in output buffers 21. For example, the voltage generated on line VOHREF may be directly applied to the gate of a transistor in series with the pull-up transistor in output driver 20 or, in another example, the voltage generated on line VOHREF may be applied to the gate of a transistor in series with the pull-up transistor in output buffer 21; in each of these alternative cases, the reference voltage on line VOHREF limits the drive applied to the output terminal. In such alternatives, however, one of ordinary skill in the art will recognize that the absolute level of the reference voltage on line VOHREF may have to be shifted from that utilized in the foregoing description.

Offset Compensating Current Source

It is desirable for voltage reference and regulator 24 to have extremely low output impedance, so that substantial current may be sourced to or sinked from line VOHREF without significant modulation of the voltage on line VOHREF. As noted above, since the voltage on line VOHREF controls the maximum output high level voltage $V_{OH}$ maximum so as not to damage an integrated circuit receiving the output logic signals at data terminals 28 while still providing the maximum output drive, it is important that the voltage on line VOHREF remain steady near the regulated level.

In voltage reference and regulator 24, therefore, it is desirable that the drive capabilities, and thus the transistor sizes (i.e., ratio of channel width to channel length, or W/L) of transistors 46 and 50 be quite large. This large size for transistors 46, 50 will allow voltage reference and regulator 24 to rapidly source current (from $V_{cc}$ through transistor 46 to line VOHREF) or sink current (from line VOHREF through transistors 50, 52 to ground). For example, the W/L of transistor 46 may be on the order of 1200, the W/L of transistor 50 may be on the order of 600, and the W/L of transistor 48, in this example, may be on the order of 300. In addition, it is desirable that the W/L of transistor 46 be larger than that of transistor 44, so that a sizable mirror ratio may be obtained, thus increasing the source current available on line VOHREF; further, it is desirable that the W/L of transistor 48 be significantly larger than that of transistor 44, for high gain. In the above example, the W/L of transistor 44 may be on the order of 60, in which case the mirror ratio of voltage reference and regulator 24 would be on the order of 20. The maximum source current $i_{source\ max}$ will be determined as follows:

$$i_{source\ max} = i_{BIAS} \frac{\left(\frac{W}{L}\right)_{46}}{\left(\frac{W}{L}\right)_{44}}$$

In the above example, the maximum source current $i_{source\ max}$ will be on the order of 20 times $i_{BIAS}$. The maximum sink current of voltage reference and regulator 24 will be equal to $i_{BIAS}$, which is controlled by bias current source 26. In this embodiment of the invention, it will of course be appreciated that the source current will be the more critical parameter for this embodiment of the invention, as it controls the turn-on of pull-up transistors 32 in output drivers 21.

However, since the currents through the reference and mirror legs of voltage reference and regulator 24 are not equal to one another, an offset voltage can develop between the nodes at the drains of transistors 44, 48, on one hand, and the drains of transistors 46, 50, on the other hand. This offset voltage can be on the order of 300 to 400 mV, and will increase with increasing $i_{BIAS}$.

Furthermore, since the W/L of transistor 48 is substantially larger than that of transistor 44 and due to the diode configuration of transistors 44 (gate tied to drain), transistor 44 is unable to rapidly pull the voltage at the drain of transistor 48 (and the gates of transistors 44, 46) high when necessary. For example, when multiple ones of output drivers 21 simultaneous switch on their respective pull-up transistors 32, substantial source current from voltage reference and regulator 24 is required to maintain the voltage on line VOHREF at the proper level. This source current tends to initially pull down the voltage on line VOHREF, which in turn will pull down the voltage at the drains of transistors 44, 48 in the reference leg of voltage reference and regulator 24, since transistor 48 will be required to temporarily supply most of the current $i_{BULK}$ required by current source 26 because virtually all of the current conducted by transistor 46 is directed to line VOHREF. However, because of its relatively small size (for high mirror ratio), transistor 44 is unable to rapidly pull up the voltage at its drain by itself; if this voltage remains low, once the transient demand for source current is over, the voltage VOHREF will overshoot its steady state voltage, because transistors 44 and 46 will be turned on strongly by the low voltage at their gates. As discussed above, overshoot of the voltage VOHREF can damage downstream integrated circuits that have lower power supply voltages.

According to the preferred embodiment of the invention, therefore, offset compensating current source 28 is provided, to source current $i_{NULL}$ into voltage reference and regulator 24 at the drains of transistors 44, 48. The size of bias current source transistor 52 must therefore be adequate to conduct the additional current $i_{NULL}$ that will be provided into the reference leg of voltage reference and regulator 24 beyond the current mirror; of course, an additional transistor may be provided in parallel with transistor 52 to conduct this additional current. The current $i_{NULL}$ is intended to equate the current per unit channel width conducted by transistor 48 with the current per unit channel width conducted by transistor 50, so that no offset voltage results, as well as easing the load of transistor 48 on transistor 44, and allowing the voltage at the drains of transistors 44 and 48, and thus at the gates of transistors 44, 46, to be rapidly pulled high when necessary. Overshoot of the voltage on line VOHREF is thus prevented.

Figure 4:
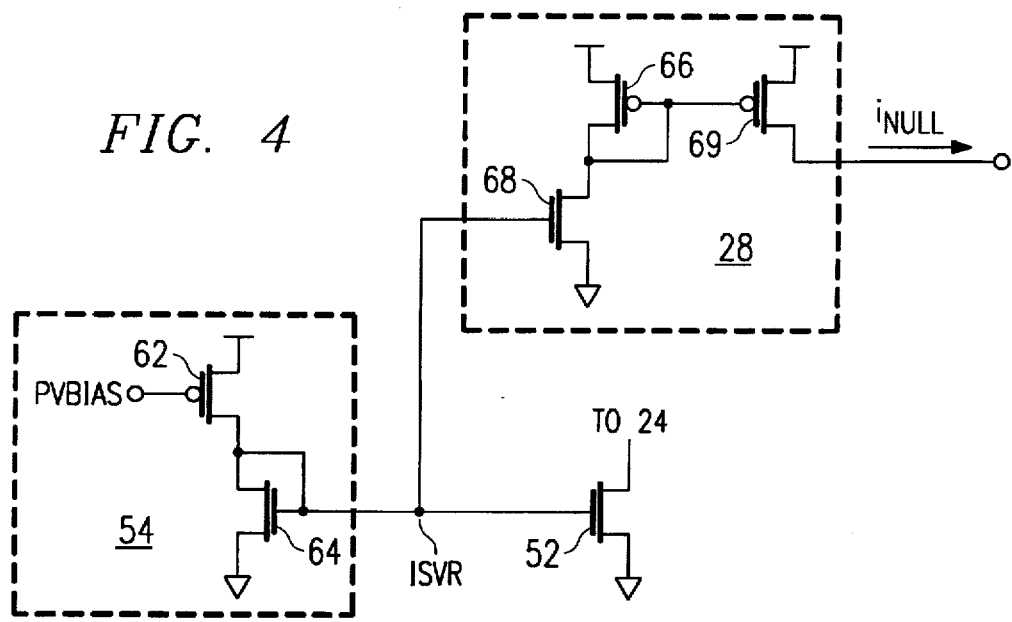
FIG. 4 is an electrical diagram, in schematic form, of a bias current source as used in the voltage reference and regulator circuit according to the preferred embodiment of the invention.

Referring now to FIG. 4, the construction of offset compensating current source 28 will be described in detail. In this particular embodiment of the invention, offset compensating current source 28 is controlled by bias reference circuit 54 in bias current source 26 to minimize the number of transistors required for implementation; of course, offset compensating current source may have its own bias reference network, if desired.

Bias reference circuit 54 is implemented by way of p-channel transistor 62 having its source biased to $V_{cc}$ and its gate biased by a reference voltage PVBIAS which may be generated by a conventional voltage reference circuit and used elsewhere in memory 10, or which is preferably generated by a compensating bias voltage reference circuit as described in copending application Ser. No. 08/357,664 (Attorney's Docket No. 94-C-114), filed Dec. 16, 1994, entitled "Circuit for Providing a Compensated Bias Voltage" assigned to SGS-Thomson Microelectronics, Inc., and incorporated herein by this reference. N-channel transistor 64 is connected in diode fashion, with its gate and drain connected to the drain of transistor 64. The sizes of transistors 62 and 64 are selected to ensure that p-channel transistor 62 remains in saturation for the specified voltage PVBIAS. For example, for a voltage PVBIAS of approximately 2 volts, transistors 62 and 64 with W/L ratios of approximately 15 will maintain transistor 62 in saturation where $V_{cc}$ is nominally 5 volts. The common node at the drains of transistors 62, 64 presents a reference voltage ISVR that is applied to the gate of transistor 52 in bias current source 26, and to offset compensating current source 28.

Because of the large currents conducted in voltage reference and regulator 24, as well as the large variations in process parameters and power supply voltages expected over temperature, it is desirable that the operation of bias reference circuit 54 be as stable as possible. The construction of bias reference circuit 54 shown in FIG. 4 provides such stability. In the above example, simulation results indicate that the ratio of maximum to minimum current conducted by transistor 52 in bias current source 26, using bias reference circuit 54 to set the gate voltage at node ISVR, over variations in temperature, process parameters, and power supply voltage, is approximately 1.17.

Offset compensating current source 28 according to this embodiment of the invention is implemented by a current mirror circuit, in which the reference leg includes p-channel transistor 66 and n-channel transistor 68. The sources of transistors 66, 68 are biased to $V_{cc}$ and ground, respectively, and their drains are connected together. The gate of n-channel transistor 68 receives the reference voltage at node ISVR from bias reference circuit 54, and the gate of p-channel transistor 66 is connected to the common drain node of transistors 66, 68, and to the gate of p-channel transistor 69 in the mirror leg, in typical current mirror fashion. Transistor 69 has its source biased to $V_{cc}$, such that its drain current provides the current $i_{NULL}$. The relative sizes of transistors 66, 69 will, of course, determine the mirror ratio, and thus the current $i_{NULL}$; a mirror ratio of on the order of 5 will be typical, to produce a current $i_{NULL}$ of on the order of 2.5 mA. As noted above, enough current capability must be provided for transistor 52 to conduct this additional current $i_{NULL}$; preferably, an n-channel transistor is provided in parallel with transistor 52, with its gate controlled by line ISVR, and having a size matching that of the mirror circuit of transistors 66, 68, 69, to conduct the additional $i_{NULL}$ current in a matched fashion.

Figure 5:
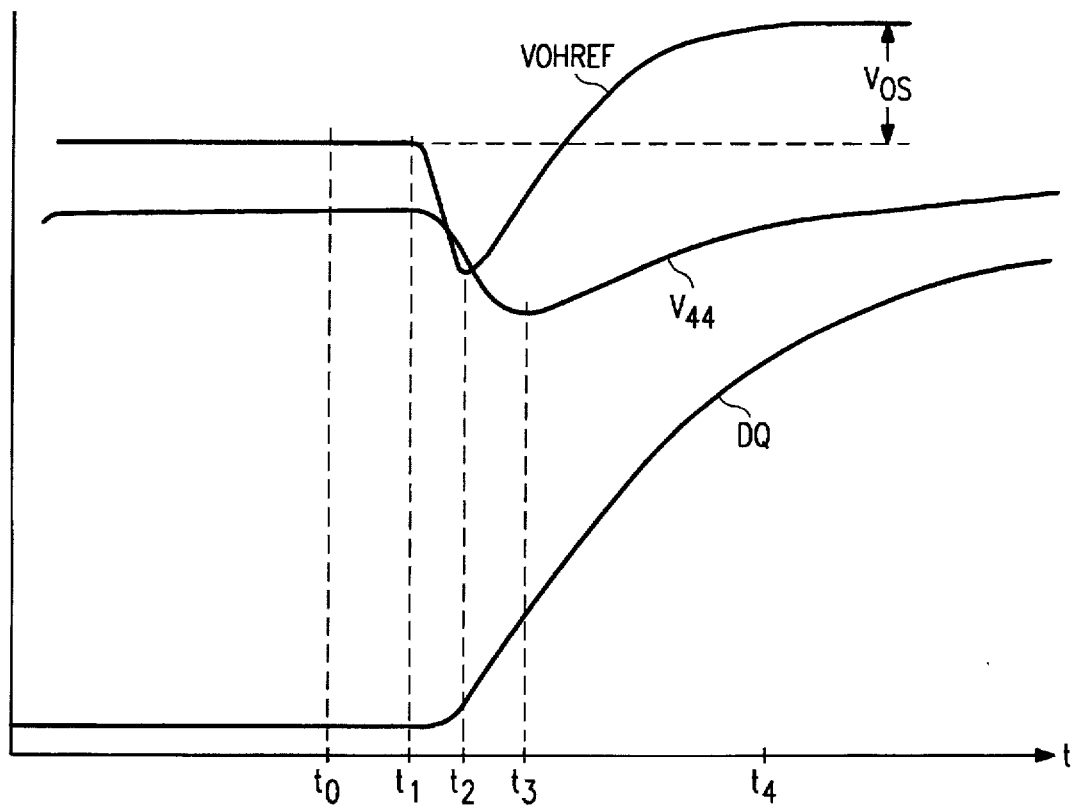
FIGS. 5 and 6 are timing plots of the operation of the voltage reference and regulator circuit according to the preferred embodiment of the invention in the absence and presence, respectively, of an offset compensating current.
Figure 6:
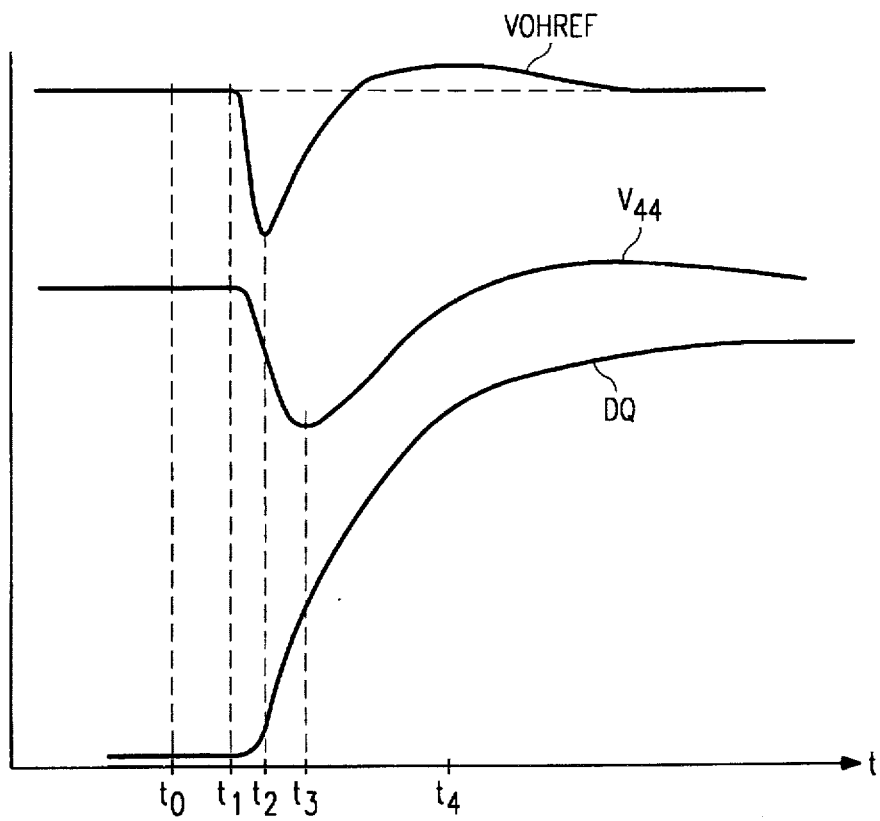

Referring now to FIGS. 5 and 6, the effect of offset compensating current source 28 on the operation of voltage reference and regulator 24 will now be described, based on simulations. FIG. 5 illustrates the operation of voltage reference and regulator 24, in the case where the current $i_{NULL}$ is zero, in other words, as if offset compensating current source 28 were not present. FIG. 5 illustrates the voltage VOHREF at the output of voltage reference and regulator 24, the voltage $V_{44}$ at the common drain node of transistors 44, 48, and the output voltage DQ on one of data terminals 28. Time $t_0$ indicates the steady-state condition of these voltages, in the case where all data terminals 28 are driving a low output voltage. In the steady-state, for example, the voltage VOHREF is preferably at 3.3 volts (the lower power supply voltage of an integrated circuit receiving the output data from memory 10) plus an n-channel threshold voltage (considering that pull-up transistor 32 in output driver 20 is an n-channel device). At time $t_1$, data terminals 28 begin switching to a new data state; in this example, the worst case condition is that where all (e.g., eighteen) data terminals 28 are to switch from a low logic level to a high logic level. As shown in FIG. 5, once this switching begins as indicated by the voltage DQ begins rising, the voltages VOHREF and $V_{44}$ dip, due to the significant source current required by output buffers 21 on line VOHREF which pulls its voltage down. The voltage $V_t$ also drops at this time, since the current through transistor 50 is reduced to near zero (all of the current in the mirror leg being required by output buffers 21), forcing transistor 48 to conduct virtually all of the current $i_{BIAS}$. This additional conduction by transistor 48 in turn drops the voltage at node $V_{44}$. Time $t_2$ indicates the end of the output transient, such that the source current demand begins decreasing, allowing the voltage on line VOHREF to rise by operation of voltage reference and regulator 24. However, as noted above, because of the small size and diode configuration of transistor 44 required for the mirror ratio to be large enough to provide the source current required by output buffers 21, the voltage at node $V_{44}$ remains low for a significant time, and does not begin to rise (slowly) until time $t_3$. So long as the voltage at node $V_{44}$ remains below its steady-state value, which maintains transistors 44 and 46 turned on strongly, the voltage at line VOHREF is allowed to rise, and indeed rises past its steady-state value by a significant margin ($V_{OS}$). This rise in VOHREF past its desired value may then be reflected via output buffers 21 and output drivers 20 onto data terminals 28, indeed to the extent as to cause damage to a lower power supply integrated circuit connected to data terminals 28.

Referring now to FIG. 6, the operation of voltage reference and regulator 24 for the example where the current $i_{NULL}$ is 2.5 mA is illustrated, based on simulation of the same conditions as that shown in FIG. 5, and having the same time scale as FIG. 5. As before, the switching occurring at time $t_1$ causes the voltages VOHREF and $V_{44}$ to drop. However, the additional current $i_{NULL}$ applied to the common drain node of transistors 44, 46 assists in the charging of this node, and as a result the time $t_s$ at which voltage $V_t$ begins to rise occurs much sooner after the initial switching time $t_1$. Since the voltage $V_{44}$ begins to rise so quickly in this case, the voltage VOHREF is not allowed to overshoot its steady-state value by nearly as much, nor for nearly as long a time, as in the case of FIG. 5 with $i_{NULL}=0$. Damage to low power supply integrated circuits connected to data terminals 28 is thus avoided.

Dynamic Control of Bias Current

As is evident from the foregoing description, it is desirable that the output impedance of voltage reference and regulator 24 be as low as possible during such times as output buffers 21 and output drivers 20 will be switching the state of data terminals 28. This low output impedance allows for significant source and sink current to be provided by voltage reference and regulator 24, without significant modulation in the voltage VOHREF. However, such low output impedance requires that the DC current through voltage reference and regulator 24 to be significant, thus causing significant steady-state power dissipation and the corresponding increase in temperature, decrease in reliability, and load on system power supplies, all of which are undesirable.

Figure 7:
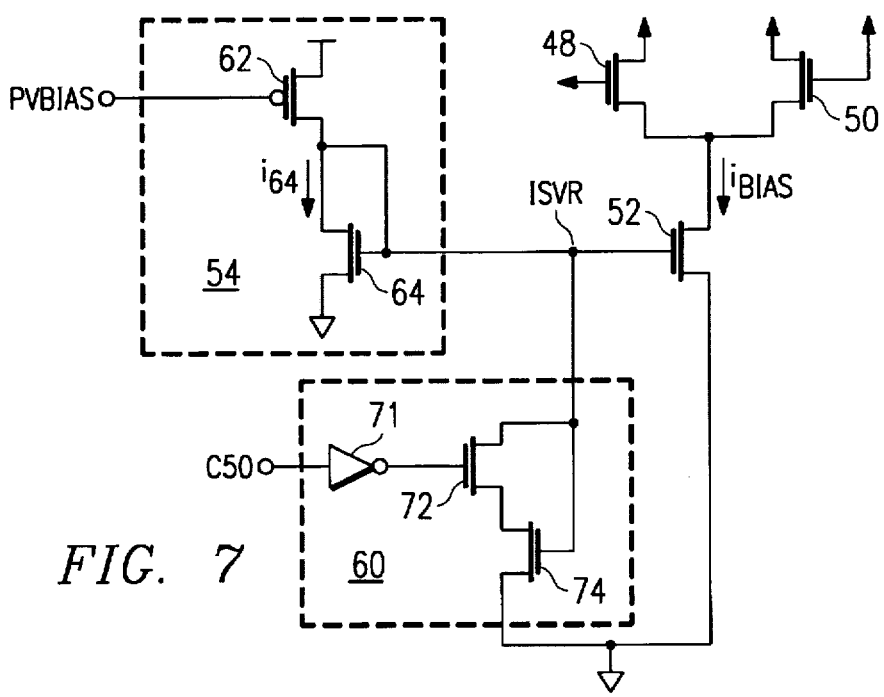
FIG. 7 is an electrical diagram, in schematic form, of a dynamic bias control circuit as used in the voltage reference and regulator circuit according to the preferred embodiment of the invention.

Referring now to FIG. 7, the construction and operation of dynamic bias circuit 60, in controlling the bias current $i_{BIAS}$ within a memory access cycle, will now be described in detail. Dynamic bias circuit 60 is provided as an optional function in voltage reference and regulator 24, for purposes of reducing the steady-state current drawn thereby. As shown in FIG. 7, dynamic bias circuit 60 receives clock signal C50, and applies it to the gate of n-channel transistor 72 via inverter 71. Transistor 72 has its drain connected to node ISVR at the output of bias reference circuit 54 and at the gate of current source transistor 52. The source of transistor 72 is connected to the drain of n-channel transistor 74, which has its gate connected to node ISVR and it source biased to ground.

In operation, so long as the clock signal C50 remains high, transistor 72 will be off and dynamic bias circuit 60 will not affect the gate bias of transistor 52 nor the value of the current $i_{BIAS}$ conducted thereby. With clock signal C50 low, however, transistor 72 will be turned on and the voltage at the gate of transistor 52 will be reduced due to transistors 72, 74 pulling node ISVR toward ground and reducing the current conducted thereby.

The extent to which the gate bias of transistor 52 is reduced by dynamic bias 60 is determined by the size of transistor 74 relative to the size of transistor 64 in bias reference circuit 54 and relative to the size of transistor 52, as will be apparent to those of ordinary skill in the art. This sizing can be readily determined, considering that the gate-to-source voltage of transistor 74 will be the same as that of transistor 64 in bias reference circuit 54. The drain-to-source voltage of transistor 74 will be less than that of transistor 64, however, by the amount of the drain-to-source voltage of transistor 72 when turned on, which will typically be quite small, for example on the order of 100 mV. With both of transistors 64, 74 in saturation, their drain currents will not be significantly affected by their drain-to-source voltages, and as such transistors 64, 74 may be considered to be in parallel with one another when transistor 72 is turned on. Since the current in transistor 52 mirrors that of transistor 64 (in parallel with transistor 74, when transistor 72 is on), clock signal C50 controls the current $i_{BIAS}$, which effectively changes the current mirror ration of transistor 64 to transistor 52.

For example, in the case where the current $i_{BIAS}$ is to be reduced to 50% of its full value except during output switching, the channel width and channel length of transistors 64 and 74 will be the same, if the channel width and channel length of transistors 64 and 52 are the same, as in this example. With transistor 72 turned off, the current $i_{BIAS}$ will equal the current $i_{64}$ through transistor 64 in bias reference circuit 54. With transistor 72 turned on (clock signal C50 low), as noted above, transistors 64, and 74 are effectively in parallel with each other and, in this example, have a channel width that is effectively twice that of transistor 52. The current mirror ratio is therefore one-half, since:

$$\frac{W_{52}}{W_{64}+W_{74}} = \frac{1}{2}$$

where $W_{52}$, $W_{64}$, $W_{74}$ are the channel widths of transistor 52, 64, 74 (channel lengths assumed to be equal). The sum $W_r+W_e$ is the effective channel width of transistors 64 and 74 in parallel with one another. Accordingly, the current $i_{BIAS}$ is reduced by one-half during such time as clock signal C50 is low.

Figure 8:
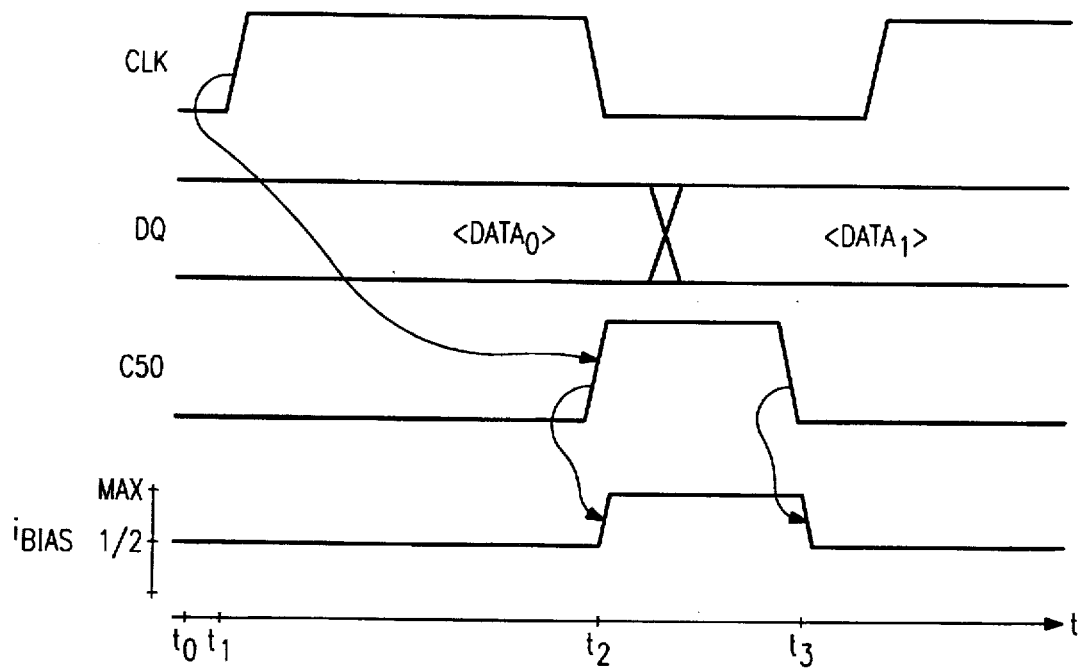
FIG. 8 is a timing diagram illustrating the operation of the circuit of FIG. 7 in an integrated circuit memory.

Referring now to FIG. 8, the operation of dynamic bias circuit 60 and its affect on the bias current $i_{BIAS}$ within a memory access cycle will now be described. Time $t_0$ illustrates the condition of memory 10 at the end of a previous cycle, in the steady state. Data terminals DQ are presenting the output data value $DATA_0$ from the prior cycle. Clock C50 is low at this time, since output switching is not occurring. Accordingly, the current $i_{BIAS}$ is at one-half of its maximum value, since transistor 72 (FIG. 7) is turned on by inverter 71, placing transistor 74 in parallel with transistor 64 of bias reference circuit 54, and thus reducing the mirror ratio of transistor 52. This reduces the current $i_{BIAS}$ drawn by voltage reference and regulator 24 during times in the memory access cycle in which output switching is not expected, and thus during which only the prior data state (i.e., $DATA_0$) is being maintained. The output impedance of voltage reference and regulator 24 may be relatively high during this time, but the voltage on line VOHREF will be maintained at its correct steady-state level.

At time $t_1$, a new memory access cycle is initiated by input clock CLK going active; alternatively, for example in a fully static memory, clock CLK may correspond to an edge transition detection pulse generated by detection of a transition at address or data input terminals of the memory. Responsive to the leading edge of clock CLK, clock signal C50 is activated after a selected delay corresponding to a time safely short of the minimum expected read access time of the memory. Once clock signal C50 becomes active at time $t_2$, transistor 72 is then turned off by operation of inverter 71. Accordingly, the current mirror ratio of transistor 52 is restored to its maximum value (unity, in this example) prior to such time as the output buffers 21 and output drivers 20 begin driving data terminals 28 to a new data state (i.e., DATA$_1$). After another delay time sufficient to ensure that the new data state DATA$_1$ is stable, clock signal C50 returns low, shown at time t$_3$ of FIG. 8. This again turns on transistor 72, reducing i$_{BIAS}$ to 50% of its maximum value, in this example, and thus reducing the DC current drawn through voltage reference and regulator 24.

Adjustable Bias Current Source

Figure 9:
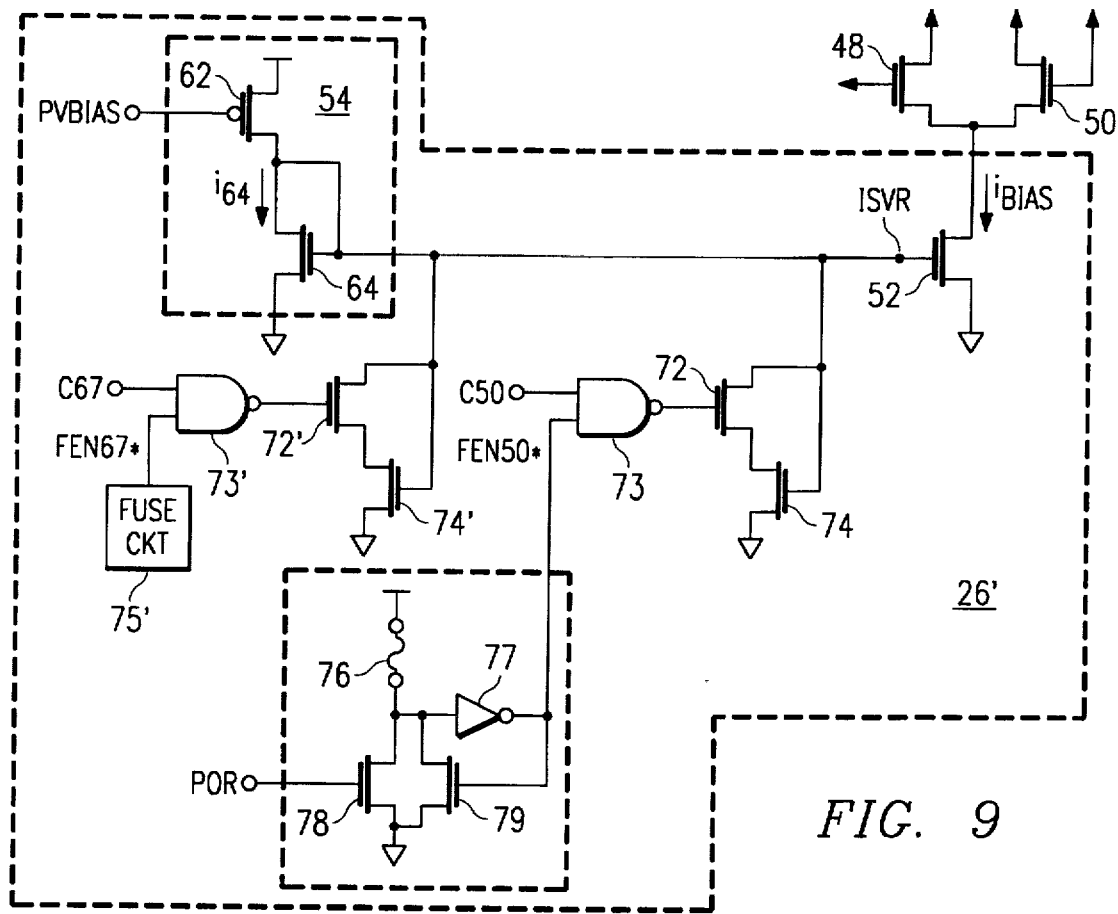
FIG. 9 is an electrical diagram, in schematic form, of a bias current source according to an alternative embodiment of the invention, including programmable bias current levels.

Referring now to FIG. 9, bias current source 26' according to an alternative embodiment of the invention will now be described in detail. Bias current source 26' provides for multiple levels of adjustment of the current i$_{BIAS}$ for voltage reference and regulator 24, controllable either by clock signals as in the case of dynamic bias circuit 60 described hereinabove, or by programming fuses.

Bias current source 26' incorporates bias reference circuit 54 and current source transistor 52, connected to voltage reference and regulator 24 as before. In addition, as described hereinabove relative to FIG. 7, transistors 72 and 74 are provided, to reduce the current i$_{BIAS}$ to 50% of its prior value when transistor 72 is turned on. In this case, however, the gate of transistor 72 is controlled by NAND function 73 which receives clock signal C50 at one input, and which receives the output of fuse circuit 75 on node FEN50, at another input.

Fuse circuit 75 provides for the programmability of the state of transistor 72 in a permanent fashion. Such programmability may be useful in the early stages of the design and manufacture of memory 10, when the optimum value of i$_{BIAS}$ has not yet been determined. In addition, programmability of the value of isles is also desirable if the process variations in the manufacture of memory 10 vary widely enough that the optimum value of isles is preferably set after initial test of the memory 10. For example, if memory 10 is processed to have very short channel widths, the value of i$_{BIAS}$ may be preferably reduced by programming fuse circuit 75 to maintain transistor 72 on at all times. Furthermore, one may program fuse circuit 75 to select a desired output slew rate.

The construction of fuse circuit 75 may be accomplished in any one of a number of conventional ways. The example of Figure 9 simply has fuse 76 connected between V$_{cc}$ and the input of inverter 77, which drives node FEN50* from its output. Transistors 78 and 79 have their source/drain paths connected between the input of inverter 77 and ground. The gate of transistor 78 receives a power on reset signal POR, such that transistor 78 pulls the input of inverter 77 to ground upon power up of memory 10. The gate of transistor 78 is connected to the output of inverter 77 at node FEN50*. In operation, with fuse 76 intact, node FEN50* is held low by operation of inverter 77. With fuse 76 open, a pulse on line POR will pull the input of inverter 77 low, driving node FEN50* high, and turning on transistor 78 to maintain this condition.

In operation, the output of NAND function 73 will be high if either clock signal C50 or node FEN50* is low. Accordingly, by not blowing fuse 76 open, node FEN50* will be held low, maintaining the output of NAND function 70 high and maintaining transistor 72 on unconditionally. With fuse 76 opened, clock signal C50 will control the state of transistor 72 as in the case of FIG. 8 described hereinabove.

Of course, it is contemplated that memory 10 may be implemented without clock signal C50, such that the state of transistor 72 is dependent solely upon the programmed state of fuse circuit 75.

Bias current source 26' according to this alternative embodiment of the invention also includes transistors 72', 74' connected in series between node ISVR and ground, in similar fashion as transistors 72, 74 previously described. The gate of transistor 72 is similarly controlled by NAND function 73', responsive to the state of clock signal C67 and to fuse circuit 75' via node FEN67*. However, the size of transistor 74' is selected to be different from that of transistor 74 so that, when transistor 72' is turned on by either clock signal C67 or by fuse circuit 75', the current i$_{BIAS}$ is selected to be at a different fraction of its maximum value. For example, if the channel width of transistor 74' is one-half that of transistor 52 and of transistor 64 in bias reference circuit 54 (assuming the same channel length), then the effective channel width of the parallel combination of transistors 64, 74' will be 1.5 times the channel width of transistor 52. Accordingly, the value of i$_{BIAS}$ with transistor 74' turned on will be two-thirds that of its maximum value with transistor 74', turned off.

Of course, other transistors of varying sizes may be similarly implemented into bias current source 26' if different values of current i$_{BIAS}$ are desired to be permanently programmed or clocked in at specific times of the memory cycle. In addition, for example, both of transistors 72, 72' may be simultaneously turned on to further reduce the current i$_{BIAS}$. It is contemplated that other combinations of reduction in current will be apparent to those of ordinary skill in the art.

According to this alternative embodiment of the invention, therefore, the value of the bias current i$_{BIAS}$ may be optimized for the particular design, for individual memory circuits depending upon the process parameters as determined by electrical test, or at specific points in time during the memory cycle. This optimization allows optimization of the tradeoff between maximum source and sink current and minimum output impedance for voltage regulator and reference 24, on the one hand, and the current drawn by voltage regulator and reference 24, on the other hand. In addition, the desired output slew rate may be selected in this optimization.

Variable Output V$_{OH}$ Control

According to another alternative embodiment of the invention, selectability of the VOHREF limiting function is provided, either by way of a logic signal or by way of fuse programmability. According to this embodiment of the invention, it is contemplated that not all memories of the same design may be specified for use in combination with other integrated circuits using lower power supplies. For example, a subset of the memories may have a V$_{OH}$ maximum of 5.0 volts, while a different subset may have a V$_{OH}$ maximum limited to 3.3 volts. For purposes of manufacturing ease and inventory control, it is preferable to have a single integrated circuit design suitable for use as either, where the decision between 5.0 volt or 3.3 volt V$_{OH}$ maximum may be made at the latest possible stage of the manufacturing process. In addition, the suitability of specific memory chips for 3.3 volt operation may depend on process parameters, such as current drive, such that certain memories may not meet the 3.3 volt operating specification even if the VOHREF limiting function is enabled, but would meet the operating specification for memories with 5.0 volt V$_{OH}$ maximum. In this case, it would be desirable to have selectability of the VOHREF limiting function after electrical test.

Further in the alternative, it may be useful to have a special test mode for memory 10, in which the VOHREF limiting function could be selectively enabled and disabled.

Figure 10:
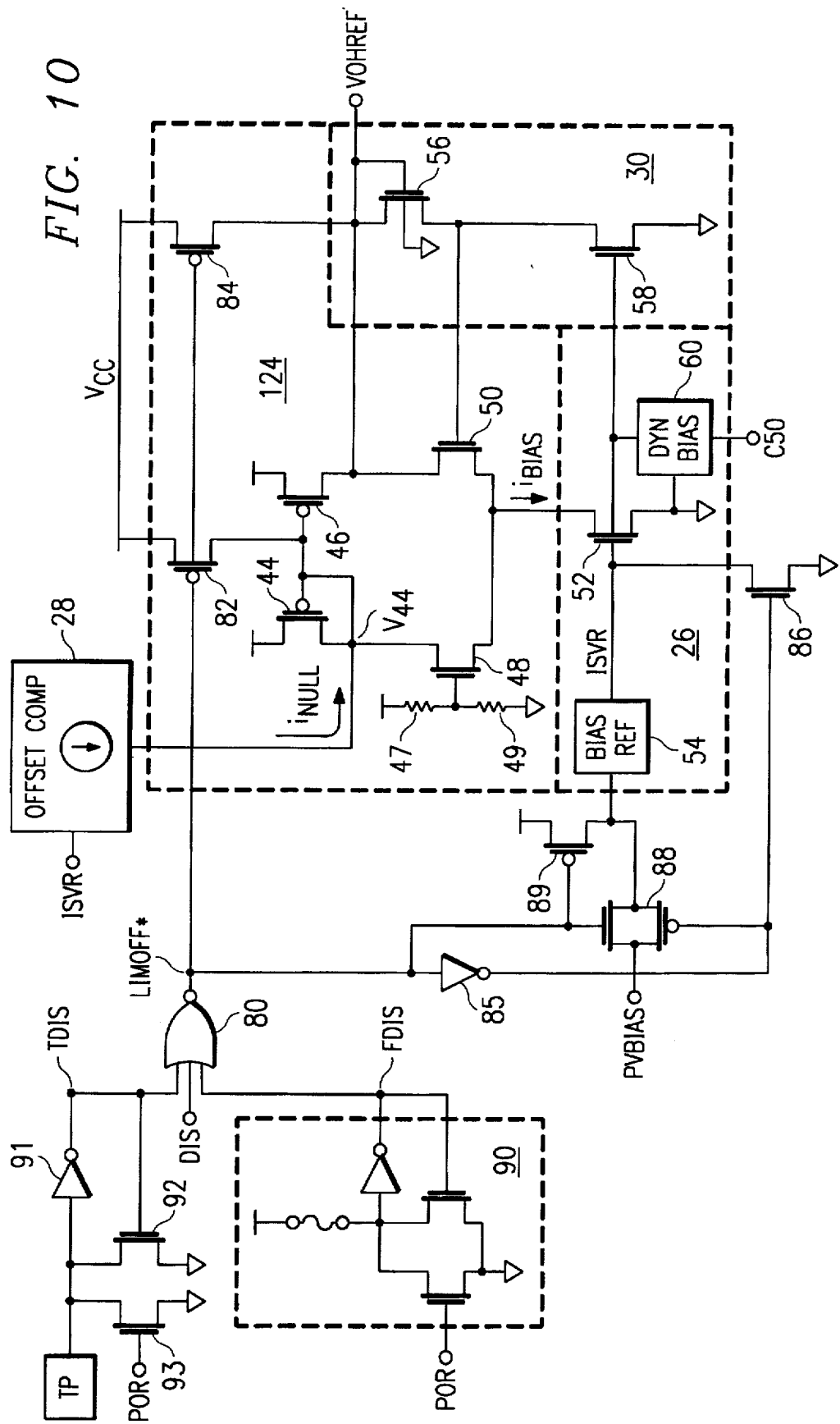
FIG. 10 is an electrical diagram, in schematic form, of a voltage reference and regulator circuit according to alternative embodiment of the invention.

Referring now to FIG. 10, an alternative embodiment of the invention is illustrated in which voltage reference and regulator 124 is similarly constructed as voltage reference and regulator 24 described hereinabove, but may be disabled by way of an external signal, a special test mode signal, or programming of a fuse circuit. Those elements common to voltage reference and regulator 24 and voltage reference and regulator 124 are referred to by the same reference numeral, and will not be described again relative to voltage reference and regulator 124 of FIG. 10.

In addition to the previously described elements, voltage reference and regulator 124 includes p-channel transistors 82, 84, 89, and n-channel transistor 86, which force certain nodes to $V_{cc}$ or to ground in the event that the VOHREF limiting function is to be disabled, as indicated by the output of NOR gate 80 as will be described hereinbelow. Each of p-channel transistors 82, 84, 89 has its source biased to $V_{cc}$, and its gate receiving line LIMOFF* from the output of NOR gate 80. The drain of transistor 82 is connected to the gates of transistors 44, 46 in the current mirror of voltage reference and regulator 124, the drain of transistor 84 is connected to line VOHREF at the output of voltage reference and regulator 124, and the drain of transistor 89 is connected to the input to bias reference circuit 54. N-channel transistor 86 has its drain connected to node ISVR in bias current source 26, has its source connected to ground, and has its gate receiving signal LIMOFF*, after inversion by inverter 85. According to this embodiment of the invention, pass gate 88 is provided between voltage PVBIAS and bias reference circuit 54, and is controlled by true and complement signals based on the signal LIMOFF*.

In operation, if line LIMOFF* at the output of NOR function 80 is at a high logic level, transistors 82, 84, 86, 89 are all turned off and pass gate 88 is turned on; in this case, voltage reference and regulator 124 operates to limit the voltage at line VOHREF in the manner described hereinabove for voltage reference and regulator 24.

However, if line LIMOFF, at the output of NOR function 80 is at a low logic level, transistors 82, 84, 86, 89 are all turned on and pass gate 88 is turned off. In this condition, line VOHREF is forced to 5.0 volts, and thus the drain voltage applied to output buffers 21 (and thus applied to the gate of pull-up transistors 32 in output drivers 20) is not limited to a reduced level. In order to minimize DC current drawn through voltage reference and regulator 124, certain nodes therein are also forced to particular voltages. In this example, the gates of transistors 44, 46 are pulled to $V_{cc}$ by transistor 82, thus turning off both of the reference and mirror legs in voltage reference and regulator 124. Pass gate 88 disconnects voltage PVBIAS from bias reference circuit 54, transistor 89 pulls the input to bias reference circuit 54 to $V_{cc}$, and transistor 86 pulls node ISVR to ground, thus turning off transistors 52 and 58. Of course, the output of NOR function 80 may also be applied to nodes within offset compensating current source 28, bias reference circuit 54, and the like, as desirable.

In this example of the invention, NOR function 80 receives three inputs, any one of which being at a high logic level will cause line LIMOFF, to be driven low. A first input is logic signal DIS, which may be generated elsewhere in memory 10, for example in timing and control circuitry 14; for example, a certain combination of inputs or instructions may be applied to memory 10 such that logic signal DIS is activated. A second input of NOR function 80, on node FDIS, is generated by fuse circuit 90. Fuse circuit 90 is constructed as described hereinabove relative to fuse circuit 75, such that node FDIS is at a low logic level with the fuse intact, and at a high logic level if the fuse is blown.

According to this embodiment of the invention, a special test pad TP can also control the enabling and disabling of voltage reference and regulator 124 during electrical test in wafer form (i.e., prior to packaging). Test pad TP is connected to the input of inverter 91, which drives node TDIS received as an input of NOR function 80. Transistor 92 has its source/drain path connected between the input of inverter 91 and ground, and has its gate connected to node TDIS at the output of inverter 91. Transistor 93 has its source/drain path connected between the input of inverter 91 and ground, and its gate controlled by the power on reset signal POR.

In operation, if test pad TP is held at $V_{cc}$, inverter 91 will force node TDIS low. However, if test pad TP is left open or is connected to ground, upon power up transistor 93 will pull the input of inverter 91 low, forcing a high logic level on node TDIS which is maintained through operation of transistor 92. It is contemplated that test pad TP can thus control the enabling and disabling of voltage reference and regulator 124 during electrical test. Depending upon the result of such testing, test pad TP may be wire-bonded to $V_{cc}$ if voltage reference and regulator 124 is to be permanently enabled, or left open (preferably hard-wired to ground) if voltage reference and regulator 124 is to be permanently disabled for a particular memory 10.

Such selective enabling and disabling of the $V_{OH}$ limiting function of the voltage reference and regulator according to the present invention is contemplated to greatly improve the manufacturing control of integrated circuits incorporating the function. In particular, integrated circuits corresponding to different specification limits may be manufactured from the same design, with selection of the maximum $V_{OH}$ voltage made late in the process, after electrical test. In addition, as noted above, fuse programming may be used to adjust the voltage divider presenting the input voltage to the voltage reference and regulator circuit, allowing additional tuning of the desired maximum $V_{OH}$ voltage.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An output driver circuit for an integrated circuit, comprising:

a pull-up drive transistor, having a conduction path coupled between a power supply voltage and an output terminal, and having a control electrode;

circuitry for limiting the drive of the pull-up drive transistor responsive to a bias voltage; and a voltage reference and regulator circuit for producing the bias voltage, comprising:

means for generating a target voltage based upon the power supply voltage;

a current mirror having a reference leg and a mirror leg, said reference leg receiving the target voltage and conducting a reference current responsive thereto, said mirror leg conducting a mirrored current responsive to the reference current and deriving the bias voltage at a bias voltage output based upon said mirrored current;

a bias current source, coupled to the reference leg and the mirror leg of the current mirror, for controlling the reference current and the mirror current conducted thereby; and circuitry for selectably biasing the bias voltage output to the power supply voltage.

2. The output driver circuit of claim 1, wherein the generating means comprises a voltage divider.

3. The output driver circuit of claim 1, wherein the circuitry for selectably biasing the bias voltage comprises:

a first disable transistor, having a conduction path connected between the bias voltage output and the power supply voltage, and having a control electrode for receiving a disable signal.

4. The output driver circuit of claim 3, wherein the bias current source comprises:

a current source transistor, having a conduction path connected between a reference voltage, on one end, the reference leg and the mirror leg of the current mirror, on the other end, and having a control electrode for receiving a bias reference voltage;

and wherein the circuitry for selectably biasing the bias voltage further comprises:

a second disable transistor, having a conduction path connected between the control electrode of the current source transistor and a voltage sufficient to turn off the current source transistor when applied to the control electrode thereof, and having a control electrode coupled to receive the disable signal.

5. The output driver circuitry of claim 3, further comprising:

a bias reference circuit, for generating a bias reference voltage responsive to a second reference voltage;

and wherein the circuitry for selectably biasing the bias voltage further comprises:

a pass gate, having a conduction path connected between the second reference voltage and the bias reference circuit, and having a control electrode receiving the disable signal, for selectably disconnecting the second reference voltage from the bias reference circuit responsive to the disable signal.

6. The output driver circuit of claim 5, wherein the circuitry for selectably biasing the bias voltage further comprises:

a third disable transistor, having a conduction path connected between the bias reference circuit and the power supply voltage, and having a control electrode coupled to receive the disable signal.

7. The output driver circuit of claim 1, wherein the current mirror comprises:

a reference p-channel transistor, having a source biased by the power supply voltage and having a drain and a gate connected together;

a reference n-channel transistor, having a drain connected to the drain of the reference p-channel transistor, having its gate receiving the target voltage, and having a source connected to the bias current source;

a mirror p-channel transistor, having a source biased by the power supply voltage, having a gate connected to the gate of the reference p-channel transistor, and having a drain coupled to produce the bias voltage; and a mirror n-channel transistor, having a source connected to the bias current source, having a drain connected to the drain of the mirror p-channel transistor, and having a gate coupled to receive the bias voltage;

and wherein the circuitry for selectably biasing the bias voltage further comprises:

a fourth disable transistor, having a conduction path connected on one end to the gates of the reference p-channel transistor and the mirror p-channel transistor, and connected on another end to the power supply voltage, and having a control electrode coupled to receive the disable signal.

8. The output driver circuit of claim 1, wherein the circuitry for limiting the drive of the pull-up transistor comprises:

an output buffer, having an input for receiving a data signal, and having an output connected to the control electrode of the pull-up drive transistor, said output buffer connected to receive the bias voltage.

9. The output driver circuit of claim 8, wherein the output buffer comprises:

a pull-up buffer transistor having a conduction path connected between the bias voltage and the control electrode of the pull-up drive transistor, and having a control electrode coupled to receive receiving the data signal;

a pull-down buffer transistor having a conduction path connected between the control electrode of the pull-up drive transistor and a reference voltage, and having a control electrode coupled to receive receiving the data signal.

10. The output driver circuit of claim 1, wherein the disable signal is a clocked signal.

11. The output driver circuit of claim 1, further comprising:

a fuse circuit for providing the disable signal responsive to the state of a fuse.

12. The output driver circuit of claim 1, wherein the disable signal is produced responsive to the voltage at a terminal of the integrated circuit.

13. The output driver circuit of claim 12, wherein the voltage is produced by bonding the terminal of the integrated circuit to a voltage.

14. A method of controlling a pull-up drive transistor in an output driver to provide a high logic level output at an output terminal having a votlage less than a power supply voltage, comprising the steps of:

receiving a limited mode disable signal at a first state or at a second state;

responsive to receiving a limiting mode disable signal at the first state, generating an output reference voltage by controlling a current mirror having a reference leg and a mirror leg, wherein the current through the reference leg is controlled by a target voltage based on the power supply voltage, and wherein the current through the mirror leg defines the output reference voltage;

responsive to receiving the limiting mode disable signal at the second state, connecting the output reference voltage to the power supply voltage;

after the generating or connecting step, applying the output reference voltage as a bias voltage to a pull-up transistor in an output buffer; and responsive to receiving a data input signal indicating that the output driver is to provide a high logic level output, turning on the pull-up transistor in the output buffer to apply the output reference voltage to the control electrode of the pull-up drive transistor.

15. The method of claim 14, further comprising:

controlling the current through the reference and mirror legs of the current mirror; and responsive to receiving the limiting mode disable step at the second state, controlling the current through the reference and mirror legs of the current mirror to be zero.

16. The method of claim 14, wherein the current mirror comprises:

a reference p-channel transistor, having a source biased by the power supply voltage and having a drain and a gate connected together;

a reference n-channel transistor, having a drain connected to the drain of the reference p-channel transistor, having its gate receiving the target voltage, and having a source connected to a bias current source;

a mirror p-channel transistor, having a source biased by the power supply voltage, having a gate connected to the gate of the reference p-channel transistor, and having a drain coupled to produce the bias voltage; and a mirror n-channel transistor, having a source connected to the bias current source, having a drain connected to the drain of the mirror p-channel transistor, and having a gate coupled to receive the bias voltage.

17. The method of claim 16, further comprising:

responsive to receiving the disable signal at the second level, connecting the gates of the p-channel reference transistor and of the p-channel mirror transistor to the power supply voltage.

18. The method of claim 14, further comprising:

generating the disable signal by programming a fuse circuit.

19. The method of claim 14, further comprising:

generating the disable signal by entry into a special test mode.

20. The method of claim 14, further comprising:

generating the disable signal by bonding a terminal to a voltage.

21. The method of claim 14, further comprising:

generating the target voltage by way of a voltage divider.

\* \* \* \* \*